(12) United States Patent
Fujimoto

(10) Patent No.: US 7,924,022 B2
(45) Date of Patent: Apr. 12, 2011

(54) EVALUATION BOARD AND FAILURE LOCATION DETECTION METHOD

(75) Inventor: Hiroyuki Fujimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 17 days.

(21) Appl. No.: 12/050,453

(22) Filed: Mar. 18, 2008

(65) Prior Publication Data

US 2008/0231287 A1    Sep. 25, 2008

(30) Foreign Application Priority Data

Mar. 19, 2007  (JP) ................. 2007-071679

(51) Int. Cl.
*G01R 31/26* (2006.01)
*G01R 31/28* (2006.01)
(52) U.S. Cl. .............. 324/527; 324/719; 324/754.22
(58) Field of Classification Search .............. None
See application file for complete search history.

(56) References Cited

U.S. PATENT DOCUMENTS

| 5,895,967 | A | * | 4/1999 | Stearns et al. | 257/691 |
| 6,710,459 | B2 | * | 3/2004 | Hsu | 257/778 |
| 6,740,965 | B2 | * | 5/2004 | Hsu et al. | 257/692 |
| 6,784,684 | B2 | * | 8/2004 | Tanimura | 324/765 |

FOREIGN PATENT DOCUMENTS

| JP | 64-65860 A | 3/1989 |
| JP | 11-111759 A | 4/1999 |

* cited by examiner

*Primary Examiner* — Paresh Patel
(74) *Attorney, Agent, or Firm* — Westerman, Hattori, Daniels & Adrian, LLP

(57) ABSTRACT

An evaluation board, on which is mounted a chip to be evaluated is provided. Particularly, the evaluation board includes a monitoring window for monitoring a power supply part, a ground part, and a surface of the chip, a first signal input part for inputting signals to the chip, and a second signal input part for inputting signals to the chip, wherein the second signal input part is placed as to sandwich said monitoring window between itself and the first signal input part.

7 Claims, 14 Drawing Sheets

● POWER SUPPLY INPUT LAND
◈ GROUND LAND
○ SIGNAL INPUT LAND

FIG. 11
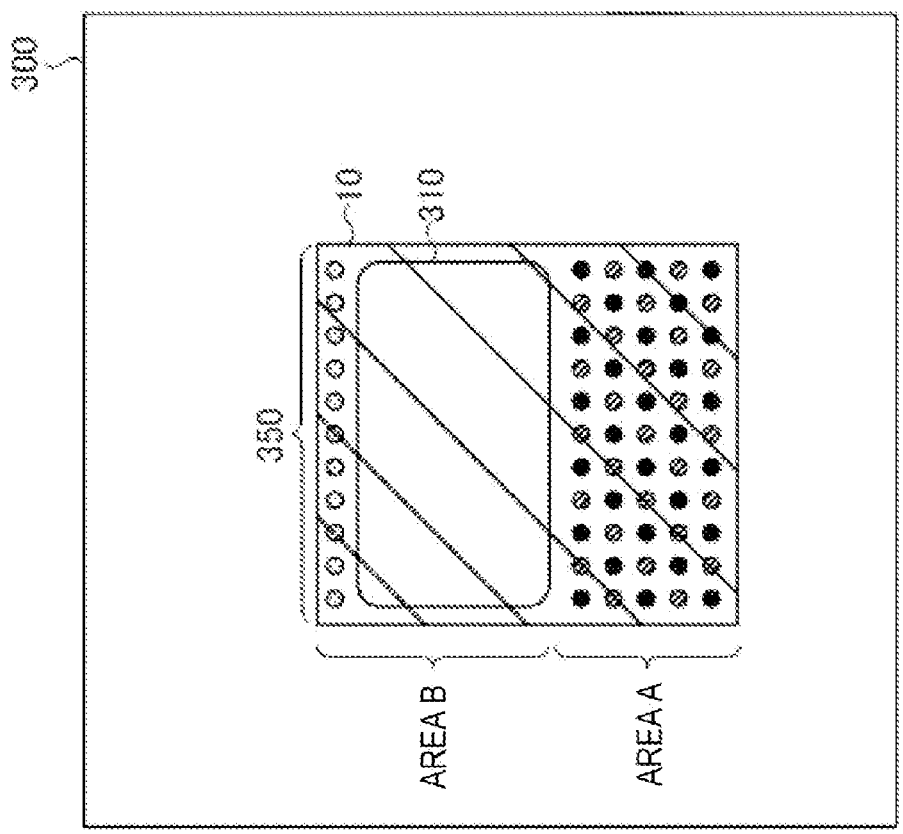
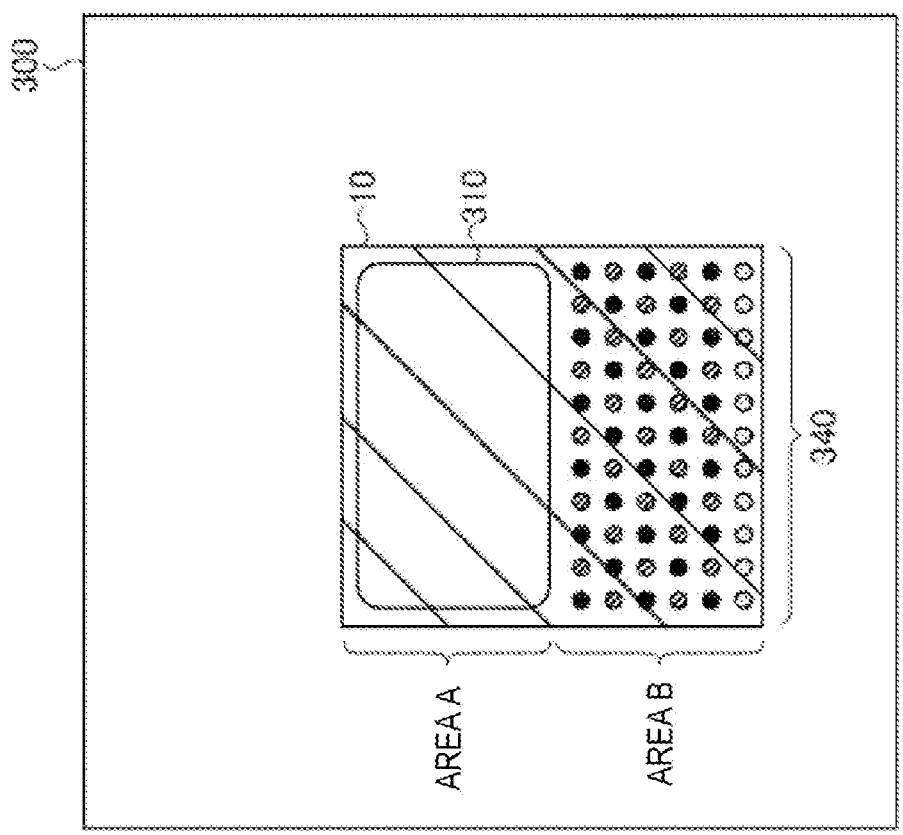
● POWER SUPPLY INPUT LAND
◉ GROUND LAND
○ SIGNAL INPUT LAND

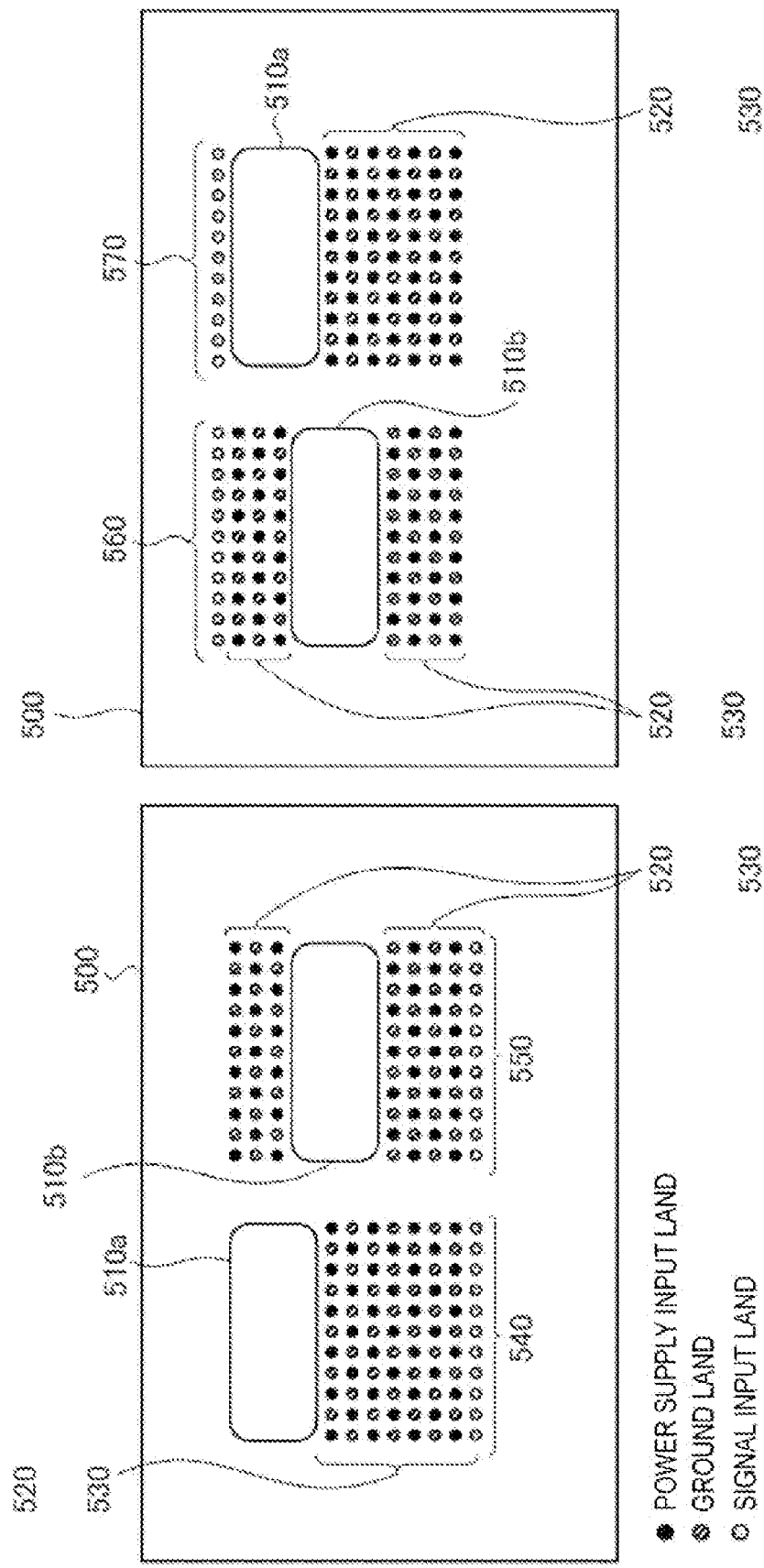

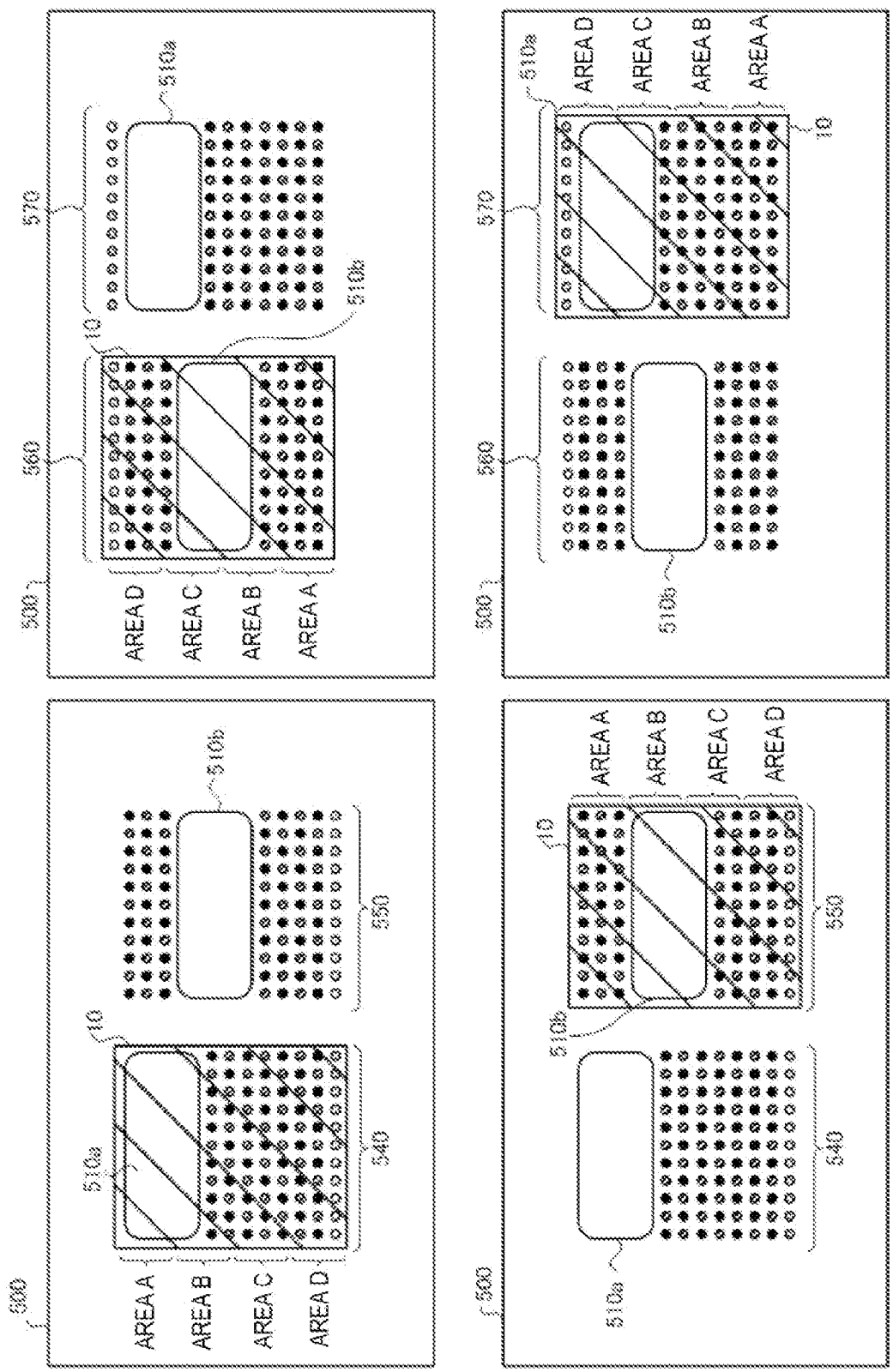

EVALUATION BOARD AND FAILURE LOCATION DETECTION METHOD

TECHNICAL FIELD

This disclosure relates to an evaluation board on which a chip is mounted to be evaluated. Specifically, this disclosure relates to an evaluation board comprising a power supply part, a ground part, and a monitoring window which monitors the surface of the above-mentioned chip. Further, this disclosure relates to a failure location detection method which uses such an evaluation board, and relates more particularly to an evaluation board that can reduce manufacturing costs and a failure location detection method which uses such an evaluation board.

BACKGROUND

Various methods of identifying failure locations on an LSI (Large Scale Integration) chip already exist. For example, as disclosed in Patent Document 1, there is the logical failure analysis method which uses an EB (Electron Beam) tester on suspected failure locations on the surface of an LSI chip, and identifies the failure locations. Further, there is the leak failure analysis method which uses a device such as an emission microscope to monitor faint luminescent states on the LSI chip surface and identifies the failure locations.

On the other hand, when identifying failure locations on a type of LSI chip which is mounted by a flip chip, the LSI chip is mounted on a board wherein a monitoring hole (monitoring window) has been opened up (hereinafter "evaluation board"). The board is mounted into an analysis apparatus, and then the failure locations are identified via the monitoring window. In addition to the monitoring window, this evaluation board has power supply bumps (BUMP) for providing power to the LSI chip, ground bumps for providing ground to the LSI chip, and signal bumps for providing "Low" and "High" electrical signals to the LSI chip.

Recent LSI chips have increasingly high performance and consume much power. So when an LSI chip is mounted on an evaluation board having a large monitoring window and failure locations are identified, the power supply bump area has become narrower, and making it impossible to provide sufficient power to the LSI chip. Therefore, the size of the monitoring window on the evaluation board is kept to a minimum, multiple types of evaluation boards having monitoring windows in different areas are being manufactured, and failure locations are being identified using evaluation boards which have monitoring windows corresponding to the suspected failure locations on the LSI chip from each evaluation board.
[Patent Document 1] Japanese Unexamined Patent Application Publication No. H11-111759

However, as mentioned above, multiple types of evaluation boards having monitoring windows in different positions are necessary to be able to monitor an entire LSI chip with an analysis apparatus. So there was a problem in which the cost of manufacturing evaluation boards became very high.

In other words, being able to analyze the failure locations across an entire LSI chip without manufacturing multiple types of evaluation boards even if the size of the monitoring windows is restricted, and reducing the manufacturing cost of evaluation boards is of paramount importance.

An object of the present disclosure, which was created to solve the above-mentioned problems with the prior art, is to provide an evaluation board which can reduce manufacturing costs and a failure location detection method which uses such a board.

SUMMARY

According to a first aspect of the present disclosure, an evaluation board on which is mounted a chip to be evaluated comprises a power supply part, a ground part, a monitoring window for monitoring the power supply part, the ground part, and a surface of the chip, a first signal input part for inputting first signals to the chip, and a second signal input part for inputting second signals to the chip, wherein the second signal input part is placed as to sandwich said monitoring window between itself and the first signal input part.

According to another aspect of the present disclosure, an evaluation board, on which the chip to be evaluated is mounted, said evaluation board comprises a power supply part, a ground part, a monitoring window for monitoring the power supply part, the ground part, and a surface of said chip, wherein said evaluation board includes a first face and second face, said power supply and said ground part are placed on said first face and said second face, said evaluation board further comprises a first signal input part, placed on said first face, for inputting first signals to said chip, and a second signal input part, positioned in an area as to sandwich said monitoring window between itself and said first signal input part, for inputting second signals to said chip.

According to a further aspect of the present disclosure, an evaluation board on which the chip to be evaluated is mounted comprises a power supply part, a ground part, a monitoring window for monitoring the power supply part, the ground part, and a surface of said chip, wherein said evaluation board has a first face and a second face, and said power supply part and said ground part are placed on said first face and said second face, a first signal input part, placed on said first face, for inputting first signals to said chip, a second signal input part, placed as to sandwich said monitoring window between itself and said first signal input part, for inputting second signals to said chip, a third signal input part, placed on said second face, for inputting third signals to said chip, and a fourth signal input part, placed as to sandwich said monitoring window between itself and said third signal input part, for inputting fourth signals to said chip.

According to a further aspect of the present disclosure, a method of failure location detection by a detection apparatus which detects failure locations on a chip to be evaluated comprises inputting signals and power to said chip to be evaluated, wherein said chip is mounted on an evaluation board, said evaluation board includes a power supply part, a ground part, a monitoring window for monitoring the power supply part, the ground part, and a face of said chip, the first signal input part for inputting first signals to said chip, and the second signal input part, placed as to sandwich said monitoring window between itself and said first signal input part, for inputting second signals to said chip, outputting electron beams to said chip via the monitoring window of said monitoring board, and obtaining information on a status of said chip which is irradiated by said electron beams.

According to a further aspect of the present disclosure, a method of failure location detection by a detection apparatus which detects failure locations on a chip to be evaluated comprises inputting signals and power to said chip to be evaluated, wherein said chip is mounted on an evaluation board, said evaluation board includes a power supply part, a ground part, a monitoring window for monitoring the power supply part, the ground part, and a face of said chip, a first signal input part for inputting first signals to said chip, and a second signal input part, placed as to sandwich said monitoring window between itself and said first signal input part, for inputting second signals to said chip, and obtaining image information of the area of said chip corresponding to the monitoring window of said evaluation board.

BRIEF DESCRIPTION OF THE DRAWINGS

FIG. 11 is an explanatory view for explaining the analyzable area of the LSI chip when the LSI chip is mounted on the evaluation board.

FIG. 14 shows the configuration of an evaluation board.

FIG. 15 is an explanatory view for explaining the analyzable area of the LSI chip when the LSI chip is mounted on the evaluation board.

DETAILED DESCRIPTION OF THE EMBODIMENT

The accompanying drawings are referenced to explain the preferred embodiments of the evaluation board and failure location detection method hereinafter in detail.

Figure 1:
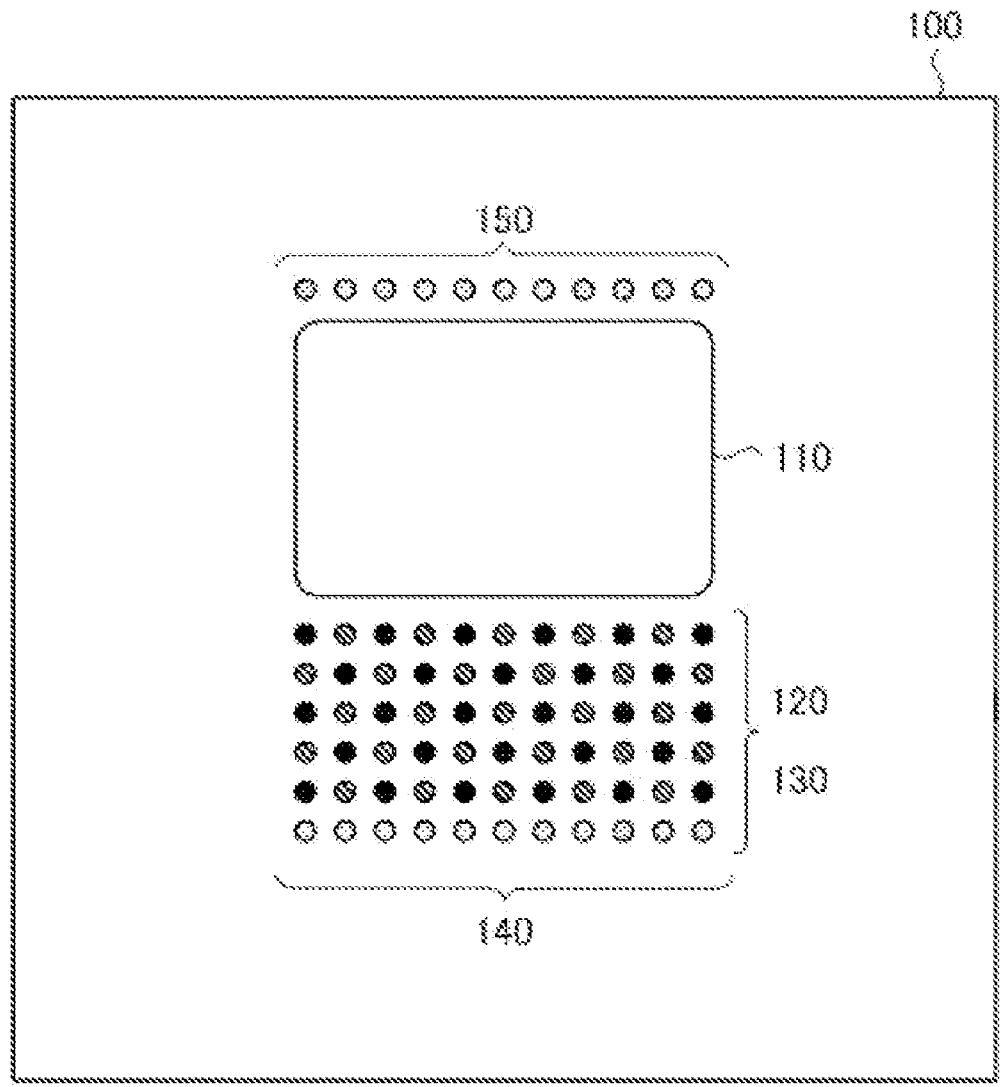
FIG. 1 illustrates the configuration of an embodiment of an evaluation board.
Figure 2:
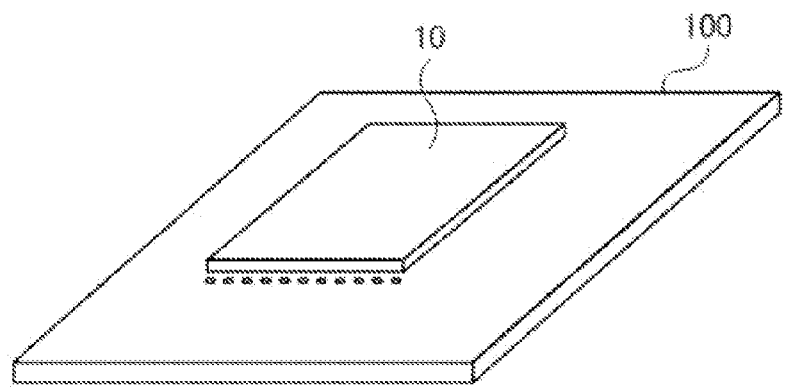
FIG. 2 illustrates an evaluation board whereon an LSI chip is mounted.

FIG. 1 shows the configuration of an embodiment of the evaluation board 100. As shown in the same drawing, the evaluation board 100 comprises a monitoring window 110, a power supply input land 120, a ground land 130, and signal input lands 140 and 150. An LSI (Large Scale Integration) chip to be evaluated is mounted on this evaluation board 100 by way of flip chip mounting. FIG. 2 shows an evaluation board whereon an LSI chip is mounted. The LSI chip 10 has a plurality of pins so that when the LSI chip 10 is mounted on the evaluation board 100, each pin is connected to the power supply input land 120, the ground land 130, and the signal input land 140 or 150 on the evaluation board.

The monitoring window 110 is a monitoring window for monitoring suspected failure locations of the LSI chip 10 to be evaluated. As shown in FIG. 2, when the LSI chip 10 is mounted on the evaluation board 100, various forms of failure analysis such as logical failure analysis or leak failure analysis can be performed on the area of the LSI chip 10 corresponding to the monitoring window 110. The size of the monitoring window 110 is nearly half the size of the LSI chip 10.

The power supply input land 120 is a land which supplies power to the pins of the LSI chip 10, and the ground land 130 is a land which supplies ground to the pins of the LSI chip. As shown in FIG. 1, the power supply input land 120 and the ground land 130 are alternately placed under the monitoring window 110 of the evaluation board 100.

The signal input land 140 is a land which inputs "Low" and "High" electrical signals to the pins of the LSI chip. The signal input land 150 is also a land which inputs "Low" and "High" electrical signals to the pins of the LSI chip. The signal input land 140 and the signal input land 150 are placed on either side of the monitoring window 110 as shown in FIG. 1.

In the general LSI chip 10, the position for inputting signals is fixed. The evaluation board 100 according to the present embodiment can analyze the entire LSI chip 10 by using a single monitoring window 100, by having the signal input lands 140 and 150 placed on either side of the monitoring window 110, and being able to set the LSI chip 10 upside down.

Figure 3:
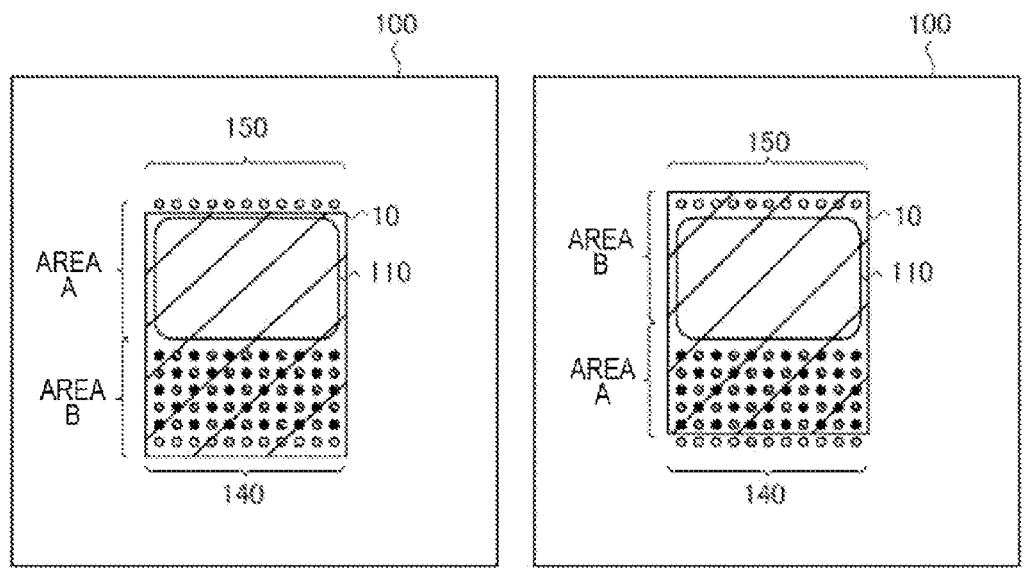
FIG. 3 is an explanatory view for explaining the analyzable area of the LSI chip when the LSI chip is mounted on the evaluation board.

Next, the analyzable area of the LSI chip 10 when the LSI chip 10 is mounted on the evaluation board 100 is explained. FIG. 3 is an explanatory view for explaining the analyzable area of the LSI chip 10 when the LSI chip 10 is mounted on the evaluation board according to the present embodiment. In addition, for the sake of explanation, the LSI chip 10 here comprises area A and area B, and the input pins which input signals are included at the end of area B of the LSI chip 10.

As shown on the left side of FIG. 3, when the LSI chip 10 is mounted on the evaluation board 100 so area A of the LSI chip 10 faces upward and area B faces downward, area A of the LSI chip 10 is placed in the position corresponding to the monitoring window 110, so analysis of the failure locations in area A can be performed. Signals are input from the signal input land 140 to the input pins in area B.

On the other hand, as shown on the right side of FIG. 3, when the LSI chip 10 is mounted on the evaluation board 100 so area B of the LSI chip faces upward and area A faces downward, area B of the LSI chip is placed in the position corresponding to the monitoring window 110, so analysis of the failure locations in area B can be performed. Signals are input from the signal input land 150 to the input pins in area B.

As illustrated in FIG. 3, by placing signal input lands 140 and 150 on the evaluation board 100 so they are on either side of the monitoring window 110, analysis of the failure locations can be performed on the entire LSI chip 10 (area A and area B). Therefore, manufacturing multiple types of evaluation boards becomes unnecessary and the manufacturing cost of evaluation boards can be reduced.

Next, the LSI chip failure location detection method using the evaluation board 100 according to the present embodiment is explained. Logical failure analysis using an EB tester and leak failure analysis using an emission microscope is explained hereinafter. Furthermore, logical failure analysis and leak failure analysis can be realized using means described in a non-patent document (Tadao Takeda, et al. "Comprehensive Failure Analysis Technology for LSI and the Actuality thereof", J-Techno Inc., ISBN4-931443-01-X, pp. 55-61, pp. 103-112) when the LSI chip 10 is mounted in an evaluation board such as that in the present embodiment.

Figure 4:
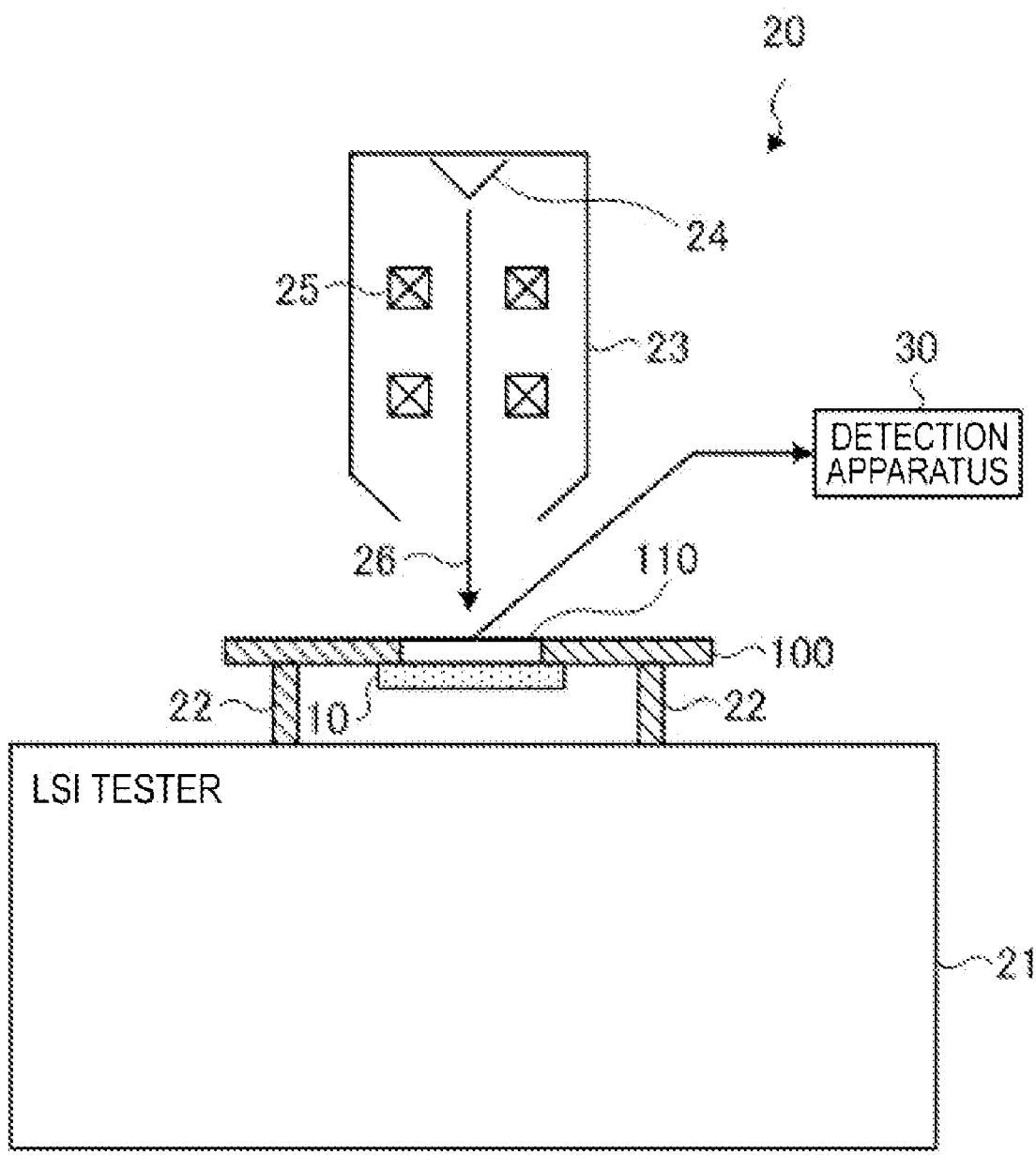
FIG. 4 illustrates the configuration of a logical failure analysis apparatus.

First, the configuration of the logical failure analysis apparatus which implements logical failure analysis on the LSI chip 10 is explained. FIG. 4 shows the configuration of the logical failure analysis apparatus 20. As shown in the same figure, this logical failure analysis apparatus comprises an LSI tester 21, an interface 22, an EB lens tube 23, an electron gun 24, an EB deflection mechanism 25, and a detection device 30. Furthermore, the evaluation board 100 onto which the LSI chip 10 is mounted is connected to the interface 22, and either the interior of the logical failure analysis apparatus 20 or the inside of the laboratory in which the logical failure analysis apparatus 20 is placed must be in a vacuum state.

Before mounting the LSI chip 10 onto the evaluation board 100, the user uses a tester to perform operation tests on the LSI chip 10, then detects in advance the locations at which LSI chip 10 failures are suspected (hereinafter "suspected failure locations"). Also, the LSI chip 10 is mounted on the evaluation board 100 so the suspected failure locations of the LSI chip 10 are included in the monitoring window 110. When explaining using FIG. 3, the LSI chip 10 is mounted on the evaluation board 100 as shown on the left side of FIG. 3 when the suspected failure locations are included in area A of the LSI chip 10, and the LSI chip 10 is mounted on the evaluation board 100 as shown on the right side of FIG. 3 when the suspected failure locations are included in area B of the LSI chip 10.

The LSI tester 21 is a device for inputting signals to the LSI chip 10 via the interface 22, and the signal input land 140 or the signal input land 150 (see FIG. 1). Also, the LSI tester 21 provides power to the LSI chip 10 via the interface 22 and the power supply input land 120.

The interface 22 is a device for connecting the evaluation board 100 and the LSI tester 21 together. The EB lens tube 23 is a tube for housing the electron gun 24 and the EB deflection mechanism. The interior of the EB lens tube 23 consists of mirrors. The electron gun 24 is a device for outputting an electron beam 26 to the LSI chip 10 via the monitoring window 110, and the EB deflection mechanism 25 is a processor for regulating the position at which the electron beam 26 irradiates the LSI chip 10. The EB deflection mechanism 25 is controlled by a control part (not shown).

The detection device 30 is a device which displays the state of secondary electrons generated from a wire at the position which is irradiated by the electron beam 26 on the monitor (not shown) as electrical potential contrast. Wires wherein the electrical potential is "High (e.g. 5 V)" darken when irradiated by the electron beam 26, but wires wherein the electrical potential is "Low (e.g. 0 V)" brighten when irradiated by the electron beam 26. The user uses electrical signals input to the LSI chip 10 by the LSI tester 21 to simulate the position of wires in which the electrical potential on the LSI chip 10 becomes "Low" and "High". Then, the user can precisely identify the failure locations in the LSI chip 10 by referencing the simulation results and the electrical potential contrast displayed on the monitor.

Figure 5:
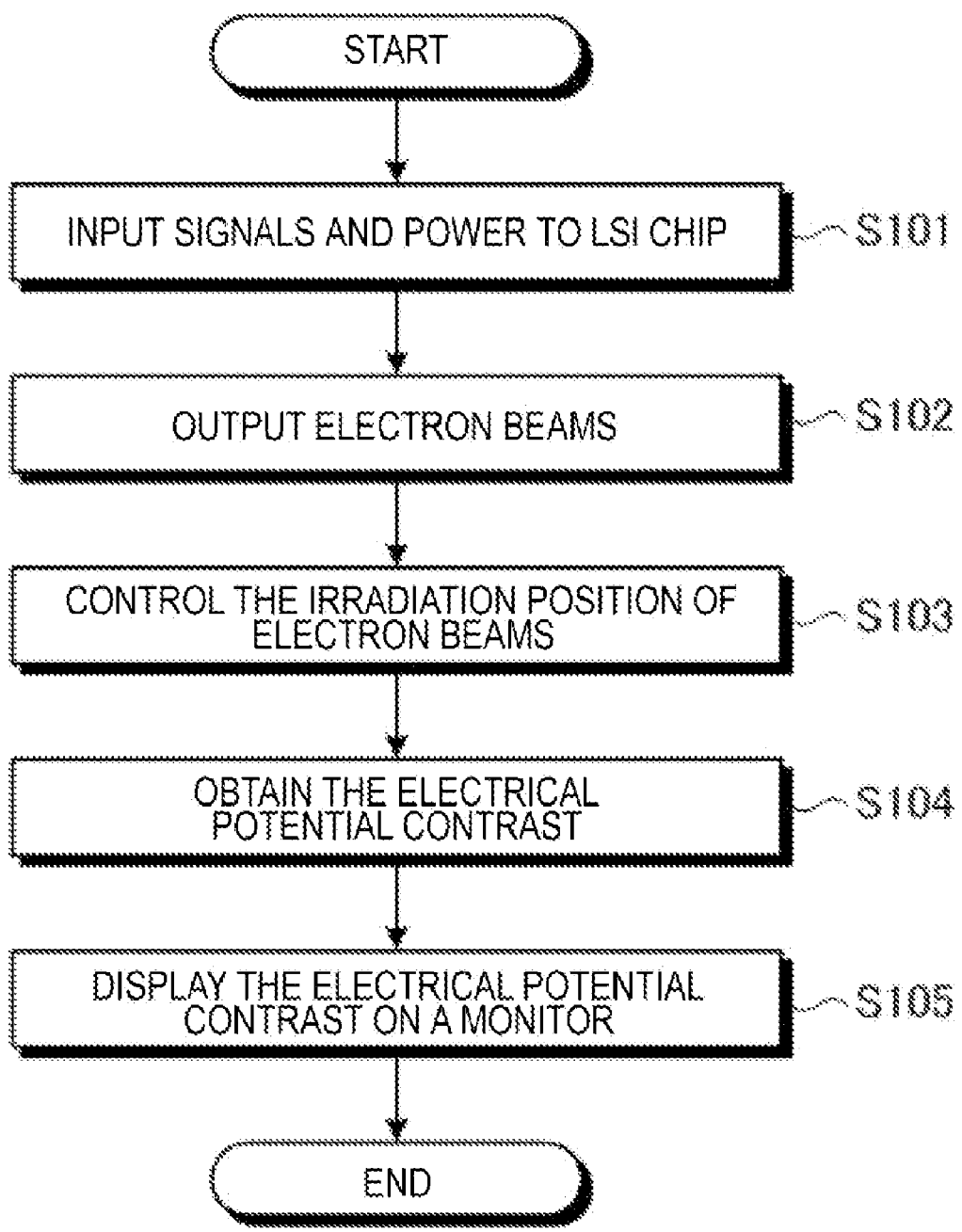
FIG. 5 is a flow chart which shows the processing sequence of the logical failure analysis apparatus.

The processing sequence of the logical failure analysis apparatus 20 will be explained hereinafter. FIG. 5 is a flow chart showing the processing sequence of the logical failure analysis apparatus 20. As shown in this figure for the logical failure analysis apparatus 20, the LSI tester 21 inputs signals and power to the LSI chip 10 (step S101), the electron gun 24 outputs the electron beam 26 (step S102), and the EB deflection mechanism 25 controls the irradiation position of the electron beam 26 according to control commands from the control part (step S103).

Then, the detection device 30 obtains the state of secondary electrons generated from a wire at the position which is irradiated by the electron beam 26 as electrical potential contrast (step S104), and then displays the obtained electrical contrast information on the monitor (step S105).

Figure 6:
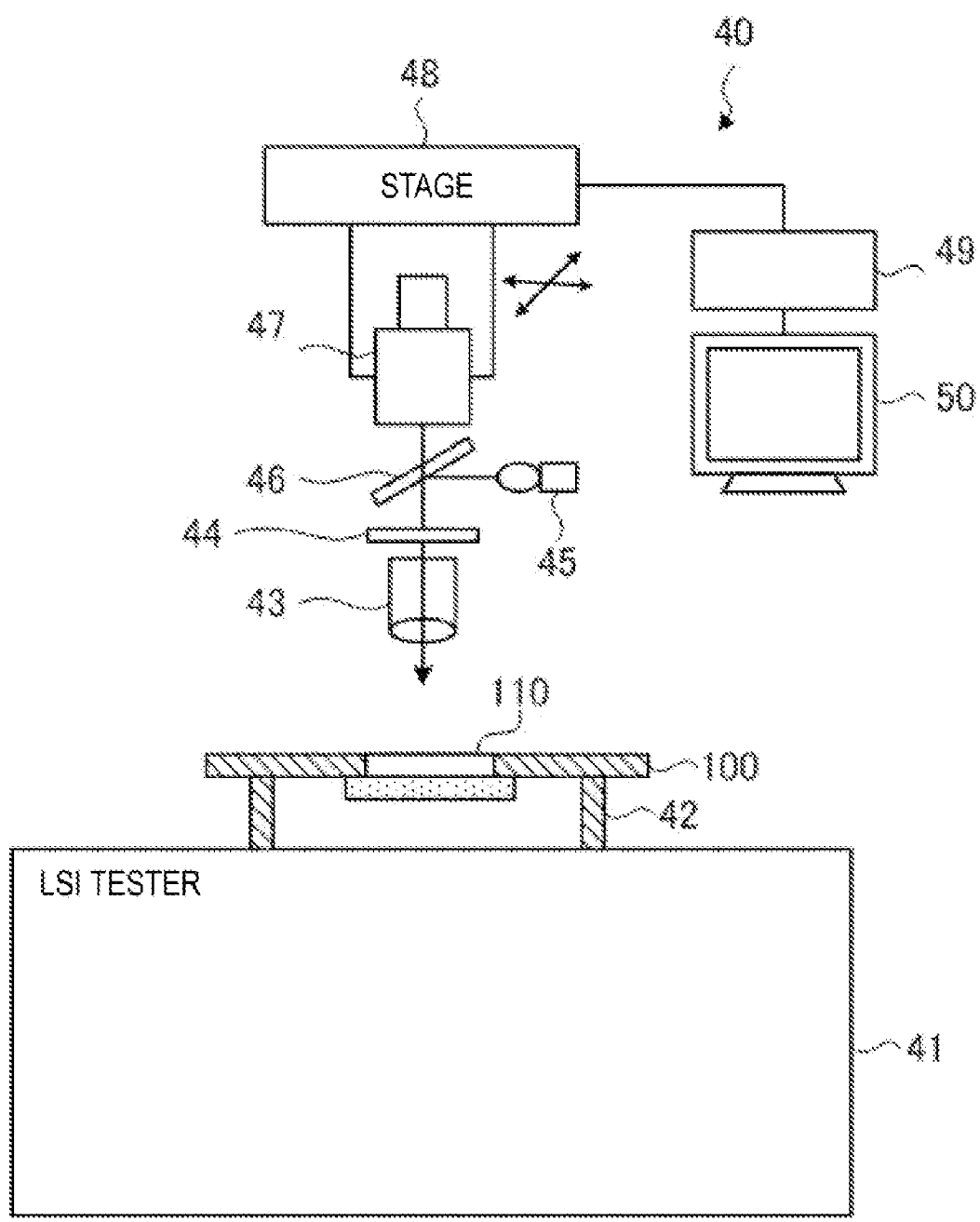
FIG. 6 illustrates the configuration of a leak failure analysis apparatus.

Next, the configuration of the leak failure analysis apparatus which performs leak failure analysis on the LSI chip 10 will be explained. FIG. 6 shows the configuration of the leak failure analysis apparatus 40. As shown in this figure, this leak failure analysis apparatus 40 comprises an LSI tester 41, an interface 42, an optical microscope 43, a BPF (band pass) filter 44, a lamp 45, a half mirror 46, a CCD camera 47, a stage 48, an image processor 49, and a monitor 50. In addition, the evaluation board 100 on which the LSI chip 10 is mounted is connected to the interface 42 and the leak failure analysis apparatus 40 must be covered by a dark box.

Similar to logical failure analysis, before mounting the LSI chip 10 on the evaluation board 100, the user uses a tester to perform an operation test on the LSI chip 10 and detects the locations of the LSI chip 10 at which failures are suspected (hereinafter suspected failure locations). Also, the LSI chip 10 is mounted on the evaluation board 100 so the suspected failure locations of the LSI chip 10 are included in the monitoring window 110. When explaining using FIG. 3, the LSI chip 10 is mounted on the evaluation board 100 as shown on the left side of FIG. 3 when the suspected failure locations are included in area A of the LSI chip 10, and the LSI chip 10 is mounted on the evaluation board 100 as shown on the right side of FIG. 3 when the suspected failure locations are included in area B of the LSI chip 10.

The LSI tester 41 is a device for inputting signals to the LSI chip 10 via the interface 42, and the signal input land 140 or the signal input land 150 (see FIG. 1). Also, the LSI tester 41 provides power to the LSI chip 10 via the interface 42 and the power supply input land 120.

The interface 42 is a device for connecting the evaluation board 100 and LSI tester 41 together, and the optical microscope 43 is a microscope which is used for detecting luminescent locations of the LSI chip 10 in a macro. The BPF filter 44 is a filter which splits light from the LSI chip 10.

The lamp 45 is a device which irradiates the LSI chip 10 with light via the half mirror 46. The CCD camera 47 is a device which obtains luminescent images from the LSI chip 10 and then outputs the luminescent images to the image processor 49. This CCD camera 47 is a cooled CCD camera with high spatial resolution whose CCD elements are cooled to −40 to −50° C. to reduce noise. The stage 48 is a device which moves the optical microscope 43 and such.

The image processor 49 is a device which obtains luminescent images of the LSI chip 10 from the CCD camera 47, performs noise reduction on the obtained luminescent images, and then outputs the images to the monitor 50. Also, the image processor 49 measures the luminescence intensity from the luminescent images and then combines this intensity with the measured luminescence intensity information and outputs [luminescent images] to the monitor 50.

The user uses the luminescent images of the LSI chip 10 displayed on the monitor 50 and the luminescence intensity as a reference to identify the failure locations on the LSI chip 10 and the cause of the failures.

Figure 7:
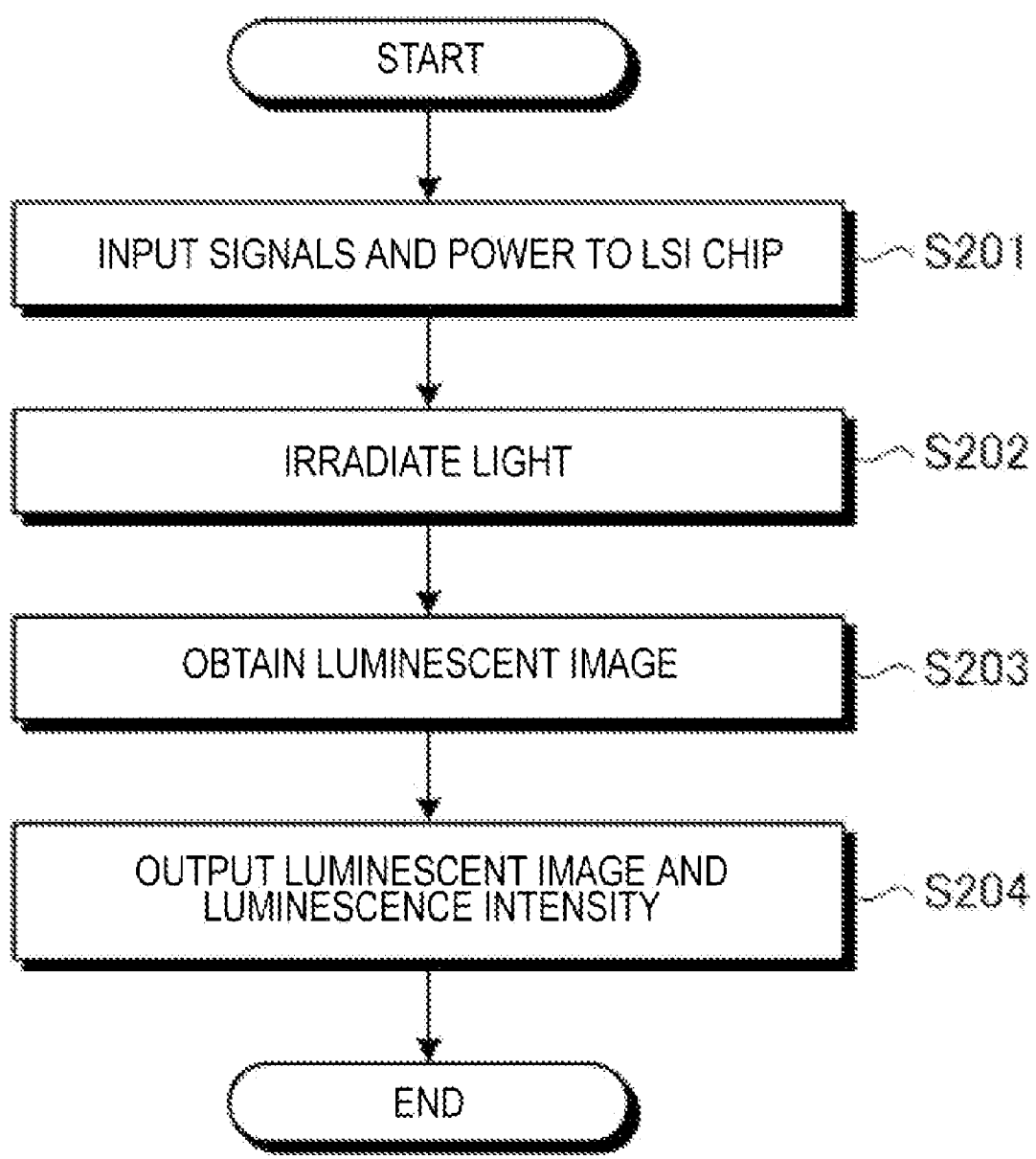
FIG. 7 is a flow chart which shows the processing sequence of the leak failure analysis apparatus.

The processing sequence of the leak failure analysis apparatus 40 is explained hereinafter. FIG. 7 is a flow chart which shows the processing sequence of the leak failure analysis apparatus 40. As shown in the same figure, in the leak failure analysis apparatus 40, the LSI tester 41 inputs signals and power to the LSI chip 10 (step S201), and the lamp 45 irradiates the LSI chip 10 with light (step S202).

Then, the CCD camera 47 obtains luminescent images of the LSI chip 10, outputs the images to the image processor 49 (step S203), and the image processor 49 reduces noise in the luminescent images and measures the luminescence intensity from the luminescent images and then outputs the luminescent image information and the luminescence intensity information to the monitor 50 (step S204).

In this way, by using only the evaluation board 100 set forth in the present embodiment, conventional logical failure analysis and leak failure analysis can be performed without manufacturing multiple types of evaluation board in advance, so the cost of performing each failure analysis can be significantly reduced.

As explained above, an evaluation board 100 according to the present embodiment comprises a monitoring window 110, power supply input land 120, ground land 130, and signal input lands 140 and 150, and signal input lands 140 and 150 are placed on either side of the monitoring window 110. Therefore, signals can be input to the LSI chip 10 even if the orientation of the LSI chip 10 is changed, and the monitoring window 110 can be aligned to the entire LSI chip 10 without manufacturing multiple types of evaluation boards. Also, the monitoring window 110 can be aligned to the entire LSI chip 10, so failure location detection can be performed on the entire LSI chip 10.

Figure 8:
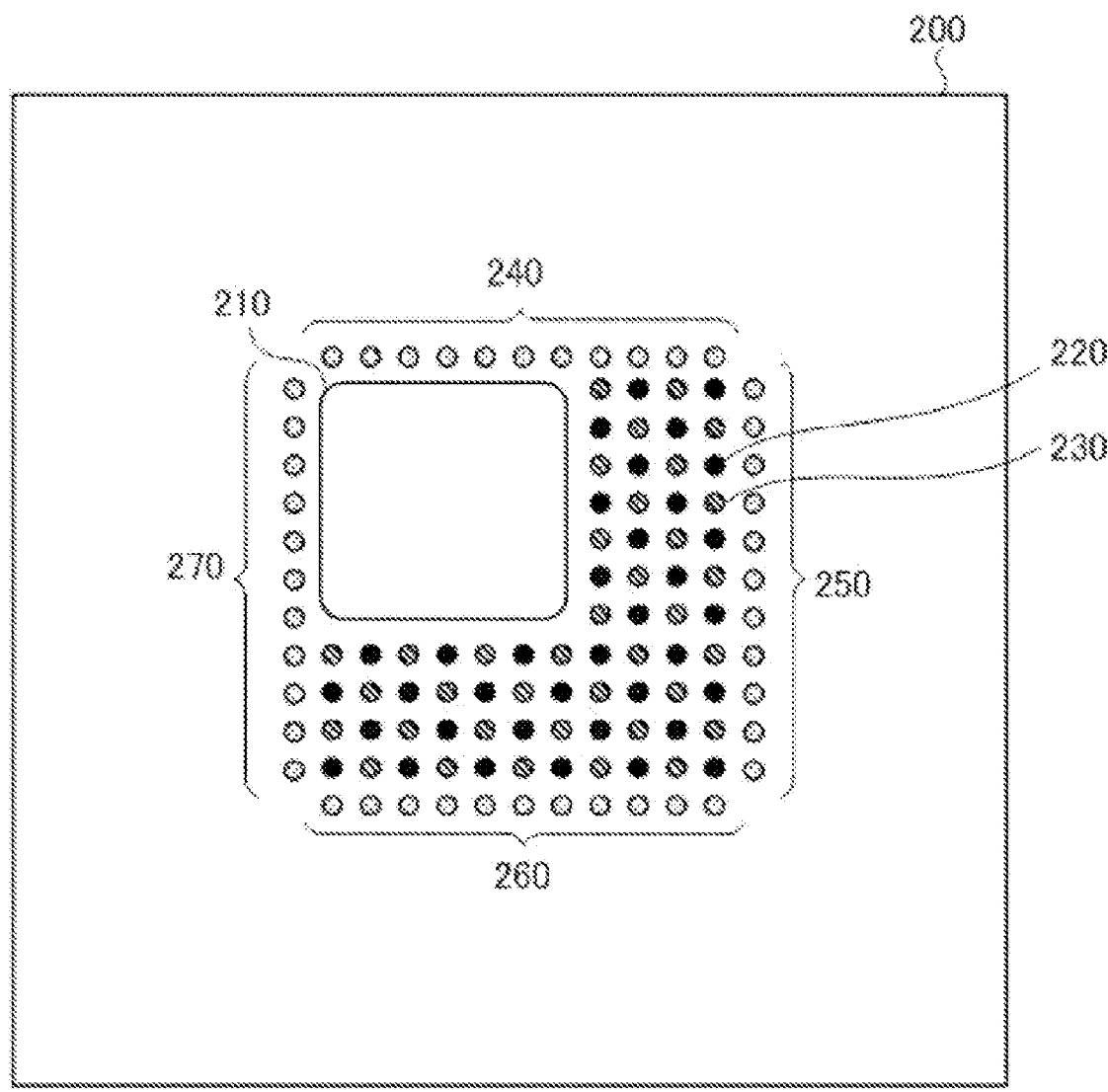
FIG. 8 shows the configuration of an evaluation board according to another embodiment.

Next, an evaluation board according to another embodiment will be explained hereinafter. FIG. 8 shows the configuration of an evaluation board 200 according to the present embodiment. As shown in the same drawing, this evaluation board 200 comprises a monitoring window 210, a power supply input land 220, a ground input land 230, and signal input lands 240, 250, 260, and 270. Mounted on this evaluation board 200 is the LSI chip 10 to be evaluated.

The monitoring window 210 is a monitoring window for monitoring suspected failure locations of the LSI chip 10 to be evaluated. When the LSI chip 10 is mounted on the evaluation board 200, various forms of failure analysis such as logical failure analysis or leak failure analysis can be performed on the area of the LSI chip 10 corresponding to the monitoring window 210. The size of the monitoring window 210 is nearly ¼ the size of the LSI chip 10.

The power supply input land 220 is a land which supplies power to the pins of the LSI chip 10, and the ground land 230 is a land which supplies ground to the pins of the LSI chip. As shown in FIG. 8, the power supply input land 220 and the ground land 230 are alternately placed on the evaluation board 200.

The signal input lands 240, 250, 260, and 270 are lands which input "Low" and "High" electrical signals to pins on the LSI chip 10. The signal input land 240 and the signal input land 260 are placed on either side of the monitoring window 210 as shown in FIG. 8. Also, the signal input land 250 and the signal input land 270 are placed on either side of the monitoring window 210.

In the general LSI chip 10, the position for inputting signals is fixed. By providing signal input lands 240, 250, 260, and 270 in an evaluation board 200 according to the present embodiment, the LSI chip 10 can be mounted rotated 90°, 180°, or 270° to the left relative to the evaluation board 200, and the entire surface of the LSI chip 10 can be analyzed with only a single monitoring window 210.

Figure 9:
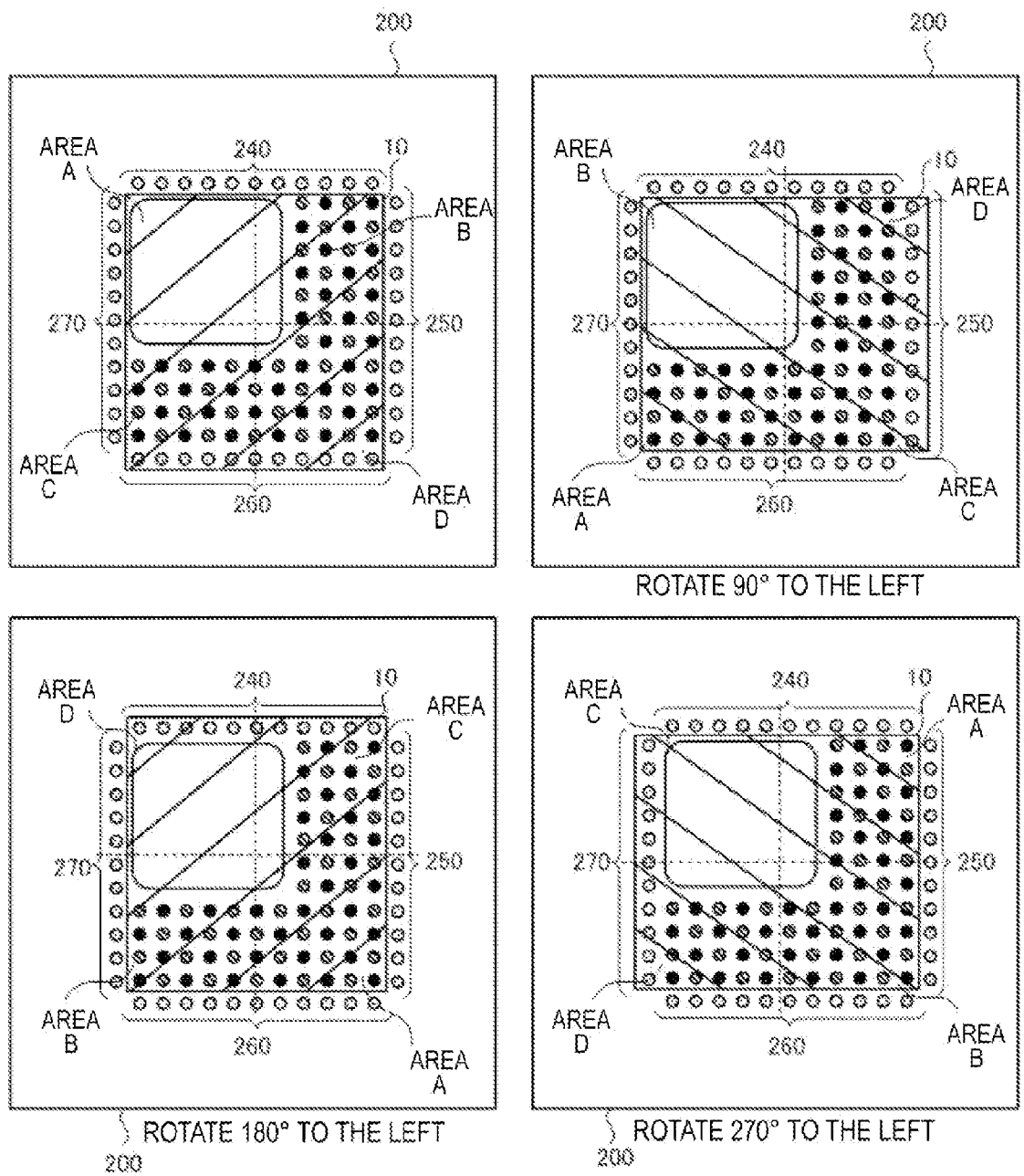
FIG. 9 is an explanatory view for explaining the analyzable area of the LSI chip when the LSI chip is mounted on the evaluation board.

Next, the analyzable area of the LSI chip 10 when the LSI chip 10 is mounted on the evaluation board 200 is explained. FIG. 9 is an explanatory view for explaining the analyzable area of the LSI chip 10 when the LSI chip 10 is mounted on the evaluation board according to the present embodiment. In addition, for the sake of explanation, the LSI chip 10 here comprises areas A through D, and the signal input pins are included in the end of area C and area D of the LSI chip 10.

As shown on the left of FIG. 9, when the LSI chip 10 is mounted on the evaluation board 200 so area A and area B of the LSI chip 10 face upward, area A is placed at the position corresponding to the monitoring window 210, so analysis of the failure locations in area A can be performed. Signals are input from the signal input land 260 to the input pins in area C and area D.

As shown in the upper right of FIG. 9, by mounting the LSI chip 10 on the evaluation board 200 so area B and area D of the LSI chip 10 face upward (when the LSI chip 10 is mounted so it is rotated 90° to the left from the position shown in the upper left of FIG. 9), area B is placed at the position corresponding to the monitoring window 210, so analysis of the failure locations can be performed on area B. Signals are input from the signal input land 250 to the input pins in area C and area D.

As shown in the lower left of FIG. 9, by mounting the LSI chip 10 on the evaluation board 200 so area D and area C of the LSI chip 10 face upward (when the LSI chip 10 is mounted so it is rotated 180° to the left from the position shown in the upper left of FIG. 9), area D is placed at the position corresponding to the monitoring window 210, so analysis of the failure locations can be performed on area D. Signals are input from the signal input land 240 to the input pins in area C and area D.

As shown in the lower right of FIG. 9, by mounting the LSI chip 10 on the evaluation board 200 so area C and area A of the LSI chip 10 face upward, in other words when the LSI chip 10 is mounted so it is rotated 270° to the left from the position shown in the upper left of FIG. 9, area C is placed at the position corresponding to the monitoring window 210, so analysis of the failure locations can be performed on area C. Signals are input from the signal input land 270 to the input pins in area C and area D.

As explained above, in the present embodiment, signal input lands 240, 250, 260, and 270 are provided on the evaluation board 200 on either side of the monitoring window 210 as shown in FIG. 8, so failure analysis can be performed on the entire LSI chip 10 (areas A through D) as explained in FIG. 9. Also, if the evaluation board 200 according to the present embodiment is used, manufacturing multiple types of evaluation boards is no longer necessary and the manufacturing cost of evaluation boards can be reduced.

Also, the monitoring window 210 is smaller than the monitoring window 110 set forth in the embodiment shown in FIG. 1, so the evaluation board 200 according to the present embodiment has more power supply input land 220 and ground input land 230 connections to the LSI chip 10 pins, and can thereby make the LSI chip 10 run in a more stable manner.

In addition, by mounting the LSI chip 10 in the evaluation board 200 according to the present embodiment, logical failure analysis and leak failure analysis like that shown in FIG. 4 and FIG. 6 can be performed.

Figure 10:
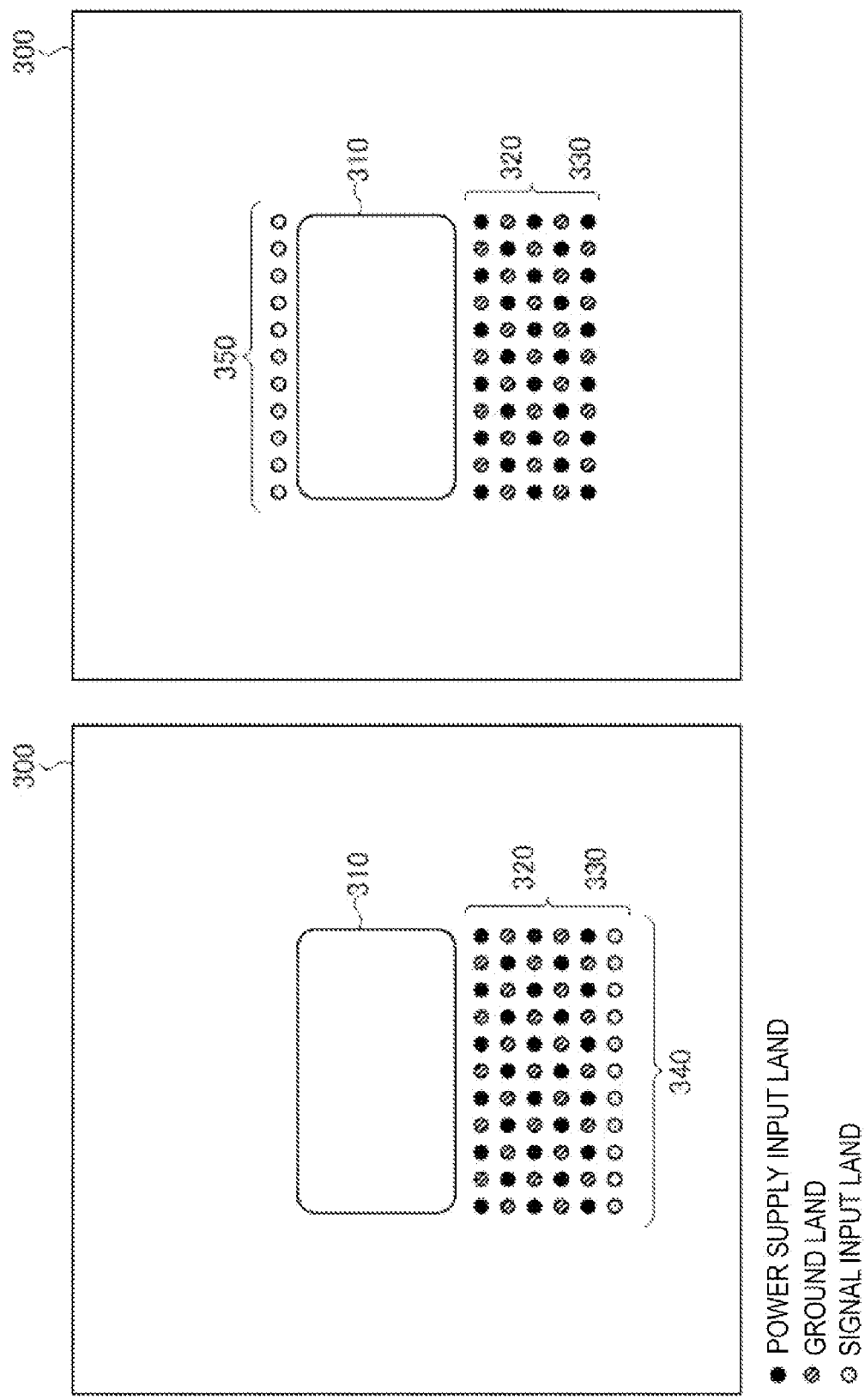
FIG. 10 shows the configuration of an evaluation board.

Next, an evaluation board according to the another embodiment will be explained hereinafter. FIG. 10 shows the configuration of the evaluation board 300 according to the present embodiment. As shown in the same figure, this evaluation board 300 is configured to have a monitoring window 310, a power supply input land 320, a ground land 330, and a signal input land 340 on the adverse side thereof, and a monitoring window 310, power supply input land 320, ground land 330, and signal input land 350 on the reverse side thereof. The LSI chip to be evaluated is mounted on the adverse side or reverse side of this evaluation board 300.

The monitoring window 310 is a monitoring window for monitoring suspected failure locations of the LSI chip 10 to be evaluated. When the LSI chip 10 is mounted on the evaluation board 300, various forms of failure analysis such as logical failure analysis or leak failure analysis can be performed on the area of the LSI chip 10 corresponding to the monitoring window 310. The size of the monitoring window 310 is nearly half the size of the LSI chip 10.

The power supply input land 320 is a land which supplies power to the pins of the LSI chip 10, and the ground land 330 is a land which supplies ground to the pins of the LSI chip. As shown in FIG. 10, the power supply input land 320 and the ground land 330 are alternately placed on the evaluation board 300. Specifically, the power supply input land 320 and ground land 330 are placed between the monitoring window 310 and the signal input land 340 on the adverse side of the evaluation board 300, and are placed under the monitoring window 310 on the reverse side.

The signal input lands 340 and 350 are lands which input "Low" and "High" electrical signals to the pins of the LSI chip 10. As shown in FIG. 10, the signal input land 340 is placed underneath the monitoring window 310 on the adverse side of the evaluation board 300. Also, the signal input land 350 is placed above the monitoring window 310 on the reverse side of the evaluation board 300. In other words, the signal input land 350 is positioned on either side of the signal input land 340 and the monitoring window 310, and is placed on the face opposite that on which the signal input land 340 was placed.

In the general LSI chip 10, the position for inputting signals is fixed. As shown in FIG. 10, by placing the signal input lands 340 and 350 on either side of the monitoring window 310 and making it possible to place the LSI chip 10 upside down, the evaluation board 300 according to the present embodiment can analyze the entire LSI chip 10 with a single monitoring window 310.

Next, the analyzable area of the LSI chip 10 when the LSI chip 10 is mounted on the evaluation board 300 is explained. FIG. 11 is an explanatory view for explaining the analyzable area of the LSI chip 10 when the LSI chip 10 is mounted on the evaluation board according to the present embodiment. In addition, for the sake of explanation, the LSI chip 10 here comprises area A and area B, and the input pins which input signals are included at the end of area B of the LSI chip 10.

As shown on the left side of FIG. 11, when the LSI chip 10 is mounted on the adverse side of the evaluation board 300 so area A of the LSI chip faces upward and area B faces downward, area A of the LSI chip is placed in the position corresponding to the monitoring window 310, so analysis of the failure locations in area A can be performed. Signals are input from the signal input land 340 to the input pins in area B.

On the other hand, as shown on the right side of FIG. 11, when the LSI chip 10 is mounted on the reverse side of the evaluation board 300 so area B of the LSI chip faces upward and area A faces downward, area B of the LSI chip is placed in the position corresponding to the monitoring window 310, so analysis of the failure locations in area B can be performed. Signals are input from the signal input land 350 to the input pins in area B.

As has been explained above, the evaluation board 300 according to the present embodiment comprises a monitoring window 310, a power supply input land 320, a ground land 330, and signal input lands 340 and 350, the signal input land 350 is placed as to sandwich monitoring window 310 between itself and the signal input land 340, and is placed on the face opposite to the face on which the input land 340 was placed. Therefore, signals can be input to the LSI chip 10 even if the orientation of the LSI chip 10 is changed, and the monitoring window 310 can be aligned to the entire LSI chip 10 without manufacturing multiple types of evaluation boards. Also, the monitoring window 310 can be aligned to the entire LSI chip 10, so failure location detection can be performed on the entire LSI chip 10.

In addition, by mounting the LSI chip 10 in the evaluation board 300 according to the present embodiment, logical failure analysis and leak failure analysis like that shown in FIG. 4 and FIG. 6 can be performed.

Figure 12:
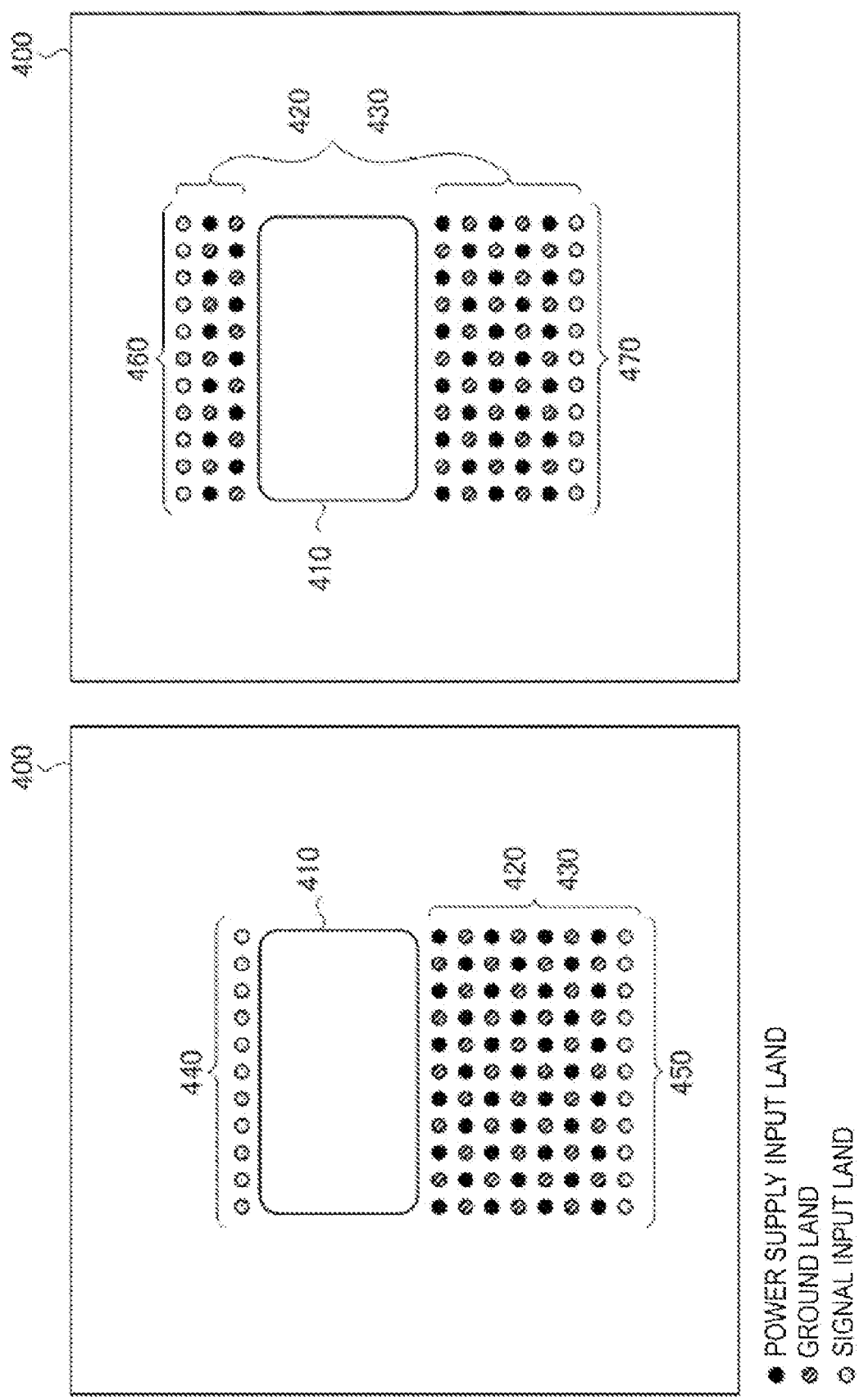
FIG. 12 shows the configuration of an evaluation board.

Next, an evaluation board according to the another embodiment will be explained hereinafter. FIG. 12 shows the configuration of an evaluation board 400 according to the present embodiment. As shown in the same figure, this evaluation board 300 is configured to have a monitoring window 410, a power supply input land 420, a ground land 430, and signal input lands 440 and 450 on the adverse side thereof, and a monitoring window 410, power supply input land 420, ground land 430, and signal input lands 460 and 470 on the reverse side thereof. The LSI chip to be evaluated is mounted on the adverse side or reverse side of this evaluation board 400.

The monitoring window 410 is a monitoring window for monitoring suspected failure locations of the LSI chip 10 to be evaluated. When the LSI chip 10 is mounted on the evaluation board 400, various forms of failure analysis such as logical failure analysis or leak failure analysis can be performed on the area of the LSI chip 10 corresponding to the monitoring window 410. The size of the monitoring window 410 is nearly ¼ the size of the LSI chip 10.

The power supply input land 420 is a land which supplies power to the pins of the LSI chip 10, and the ground land 430 is a land which supplies ground to the pins of the LSI chip 10. As shown in FIG. 12, the power supply input land 420 and the ground land 430 are alternately placed on the evaluation board 400. Specifically, on the adverse side of the evaluation board 400, the power supply input land 420 and ground land 430 are placed between the monitoring window 410 and signal input land 450, and on the reverse side of the evaluation board 400, the power supply input land 420 and ground land 430 are placed between the signal input land 460 and the monitoring window 410 and between the monitoring window 410 and the signal input land 470.

The signal input lands 440, 450, 460, and 470 are lands which input "Low" and "High" electrical signals to pins on the LSI chip 10. As shown in FIG. 12, the signal input land 440 is placed above the monitoring window 410 on the adverse side of the evaluation board 400. Also, the signal input land 450 is placed as to sandwich monitoring window 410 between itself and the signal input land 440.

Also, the signal input land 460 is placed above the monitoring window 410 on the reverse side of the evaluation board 400. Also, the signal input land 470 is placed as to sandwich monitoring window 410 between itself and the signal input land 460.

In the general LSI chip 10, the position for inputting signals is fixed. As shown in FIG. 12, by placing the signal input lands 440, 450, 460, and 470 on either side of the monitoring window 410 and making it possible to place the LSI chip 10 upside down, the evaluation board 400 according to the present embodiment can analyze the entire LSI chip 10 with a single monitoring window 410.

Figure 13:
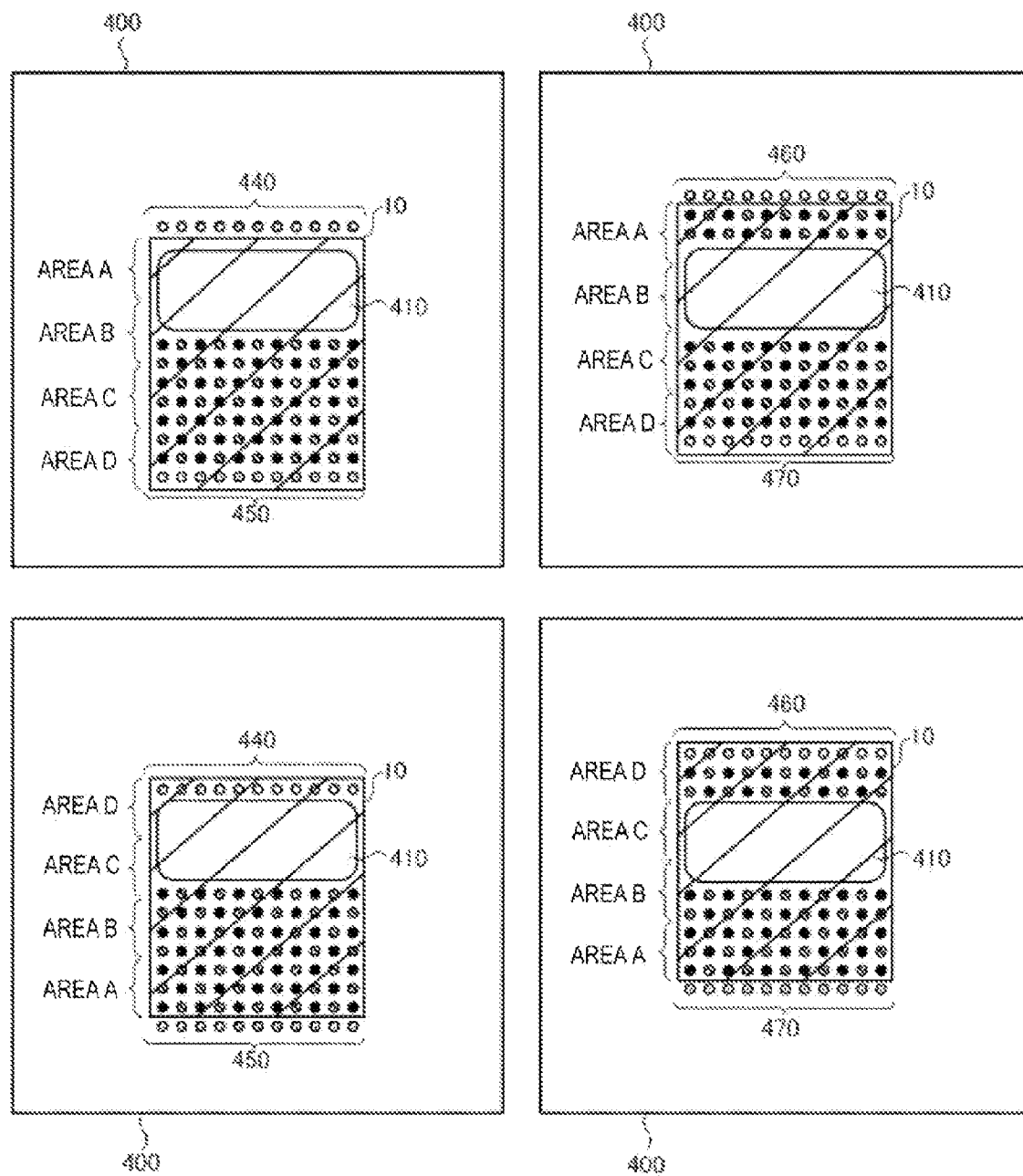
FIG. 13 is an explanatory view for explaining the analyzable area of the LSI chip when the LSI chip is mounted on the evaluation board.

Next, the analyzable area of the LSI chip 10 when the LSI chip 10 is mounted on the evaluation board 400 is explained. FIG. 13 is an explanatory view for explaining the analyzable area of the LSI chip 10 when the LSI chip 10 is mounted on the evaluation board according to the present embodiment. In addition, for the sake of explanation, the LSI chip 10 here comprises areas A through D, and the input pins which input signals are included at the end of area D of the LSI chip 10.

As shown on the upper left of FIG. 13, in the state where area A of the LSI chip 10 faces upward and area D faces downward, when the LSI chip 10 is mounted on the adverse side of the evaluation board 400, area A of the LSI chip 10 is placed in the position corresponding to the monitoring window 410, so analysis of the failure locations in area A can be performed. Signals are input from the signal input land 450 to the input pins in area D.

As shown on the upper right of FIG. 13, in the state where area A of the LSI chip 10 faces upward and area D faces downward, when the LSI chip 10 is mounted on the reverse side of the evaluation board 400, area B of the LSI chip 10 is placed in the position corresponding to the monitoring window 410, so analysis of the failure locations in area B can be performed. Signals are input from the signal input land 470 to the input pins in area D.

As shown on the lower left of FIG. 13, in the state where area D of the LSI chip 10 faces upward and area A faces downward, when the LSI chip 10 is mounted on the adverse side of the evaluation board 400, area D of the LSI chip 10 is placed in the position corresponding to the monitoring window 410, so analysis of the failure locations in area D can be performed. Signals are input from the signal input land 440 to the input pins in area D.

As shown on the lower right of FIG. 13, in the state where area D of the LSI chip 10 faces upward and area A faces downward, when the LSI chip 10 is mounted on the reverse side of the evaluation board 400, area C of the LSI chip 10 is placed in the position corresponding to the monitoring window 410, so analysis of the failure locations in area C can be performed. Signals are input from the signal input land 460 to the input pins in area D.

As explained above, the evaluation board 400 according to the present embodiment comprises a monitoring window 410, a power supply input land 420, a ground land 430, and signal input lands 440 and 450 on the adverse face thereof, and comprises a monitoring window 410, a power supply input land 420, a ground land 430, and signal input lands 460 and 470 on the reverse side thereof. Also, on the adverse side of the evaluation board 400, the signal input land 440 is placed as to sandwich monitoring window 410 between itself and the signal input land 450. Similarly, on the reverse side of the evaluation board, the signal input land 460 is placed as to sandwich monitoring window 410 between itself and the signal input land 470. Furthermore, the power supply input land 420 and ground land 430 are placed between the monitoring window 410 and the signal input land. Therefore, in the present embodiment, detecting failure locations is possible across the entire LSI chip 10 without manufacturing various types of evaluation boards.

Also, the monitoring window 410 on the evaluation board 400 according to the present embodiment is smaller than the monitoring window 110 of the embodiment shown in FIG. 1. Therefore, the number of power supply input lands 420 and ground input lands 430 connected to the pins of the LSI chip 10 increases, making it possible to run the LSI chip 10 in a more stable manner.

In addition, by mounting the LSI chip 10 in the evaluation board 400 according to the present embodiment, logical failure analysis and leak failure analysis like that shown in FIG. 4 and FIG. 6 can be performed.

Next, an evaluation board according to the another embodiment will be explained hereinafter. FIG. 14 shows the configuration of an evaluation board 500 according to the present embodiment. As shown in the same figure, this evaluation board 500 is configured to have monitoring windows 510a and 510b, a power supply input land 520, a ground land 530, and a signal input land 540 on the adverse side thereof, and monitoring windows 510a and 510b, a power supply input land 520, a ground land 530, and signal input lands 560 and 570 on the reverse side thereof. The LSI chip to be evaluated is mounted on the adverse side or reverse side of this evaluation board 500.

The monitoring windows 510a and 510b are monitoring windows for monitoring suspected failure locations of the LSI chip 10 to be evaluated. When the LSI chip 10 is mounted on the evaluation board 500, various forms of failure analysis such as logical failure analysis or leak failure analysis can be performed on the area of the LSI chip 10 corresponding to the monitoring window 510a or 510b. The size of monitoring windows 510a and 510b is nearly ¼ the size of the LSI chip 10.

The power supply input land 520 is a land which supplies power to the pins of the LSI chip 10, and the ground land 530 is a land which supplies ground to the pins of the LSI chip. As shown in FIG. 14, the power supply input land 520 and the ground land 530 are alternately placed on the evaluation board 500. Specifically, on the adverse side of the evaluation board 500, the power supply input land 520 and ground land 530 are placed between the monitoring window 510a and the signal input land 540, between the monitoring window 510b and the signal input land 550, and above the monitoring window 510b. Also, on the reverse side of the evaluation board 500, the power supply input land 520 and the ground land 530 are placed between the monitoring window 510b and the signal input land 560, underneath the monitoring window 510b, and underneath the monitoring window 510a.

The signal input lands 540, 550, 560, and 570 are lands which input "Low" and "High" electrical signals to pins on the LSI chip 10. As shown in FIG. 14, the signal input land 540 is placed underneath the monitoring window 510a on the adverse side of the evaluation board 500. Also, the signal input land 550 is placed underneath the monitoring window 510b on the adverse side of the evaluation board 500. Also, the signal input land 560 is placed above the monitoring window 510b on the reverse side of the evaluation board 500, and the signal input land 570 is placed above the monitoring window 510a.

In the general LSI chip 10, the position for inputting signals is fixed. Then, by placing the signal input lands 540, 550, 560, and 570 above or underneath the monitoring windows 510a and 510b, and making it possible to place the LSI chip 10 upside down, the evaluation board 500 according to the present embodiment can analyze the entire LSI chip 10 with only the monitoring windows 510a and 510b.

Next, the analyzable area of the LSI chip 10 when the LSI chip 10 is mounted on the evaluation board 500 is explained. FIG. 15 is an explanatory view for explaining the analyzable area of the LSI chip when the LSI chip is mounted on the evaluation board according to the present embodiment. In addition, for the sake of explanation, the LSI chip 10 here comprises areas A through D, and the input pins which input signals are included at the end of area D of the LSI chip 10.

As shown on the upper left of FIG. 15, when the LSI chip 10 is mounted on the adverse side of the evaluation board 500 so area A of the LSI chip 10 faces upward and area D faces downward, area A of the LSI chip 10 is placed in the position corresponding to the monitoring window 510a, so analysis of the failure locations in area A can be performed. Signals are input from the signal input land 540 to the input pins in area D.

As shown on the lower left of FIG. 15, when the LSI chip 10 is mounted on the right side of the adverse side of the evaluation board 500 so area A of the LSI chip 10 faces upward and area D faces downward, area B of the LSI chip 10 is placed in the position corresponding to the monitoring window 510b, so analysis of the failure locations in area B can be performed. Signals are input from the signal input land 550 to the input pins in area D.

As shown on the upper right of FIG. 15, when the LSI chip 10 is mounted on the left side of the reverse side of the evaluation board 500 so area D of the LSI chip 10 faces upward and area A faces downward, when the LSI chip 10 is mounted on the left side of the reverse side of the evaluation board 500, area C of the LSI chip 10 is placed in the position corresponding to the monitoring window 510b, so analysis of the failure locations in area C can be performed. Signals are input from the signal input land 560 to the input pins in area D.

As shown on the lower right of FIG. 15, when the LSI chip 10 is mounted on the right side of the reverse side of the evaluation board 500 so area D of the LSI chip 10 faces upward and area A faces downward, area D of the LSI chip 10 is placed in the position corresponding to the monitoring window 510a, so analysis of the failure locations in area D can be performed. Signals are input from the signal input land 570 to the input pins in area D.

As explained above, an evaluation board 500 according to the present embodiment comprises monitoring windows 510a and 510b, a power supply input land 520, a ground land 530, and signal input lands 540, 550, 560, and 570. Also, the signal input land 540 is placed underneath the monitoring window 510a on the adverse side of the evaluation board 500, the signal input land 550 is placed underneath the monitoring window 510b on the adverse side of the evaluation board 500, the signal input land 560 is place above the monitoring window 510b on the reverse side of the evaluation board 570, and the signal input land 570 is placed above the monitoring window 510a on the reverse side of the evaluation board 500. Therefore, with the present embodiment, signals can be input to the LSI chip 10 even if the orientation of the LSI chip 10 is changed, and the monitoring window 510a or 510b can be aligned to the entire LSI chip 10 without manufacturing multiple types of evaluation boards.

Also, the monitoring windows 510a and 510b on the evaluation board 500 according to the present embodiment are smaller than the monitoring window 110 of the evaluation board shown in FIG. 1. Therefore, the number of power supply input lands 520 and ground input lands 530 connected to the pins of the LSI chip 10 increases, making it possible to run the LSI chip 10 in a more stable manner.

In addition, by mounting the LSI chip 10 in the evaluation board 500 according to the present embodiment, logical failure analysis and leak failure analysis like that shown in FIG. 4 and FIG. 6 can be performed.

According to the present disclosure, signals can be input to the chip even if the orientation of the chip is changed, and a monitoring window can be aligned to the entire chip without manufacturing multiple types of evaluation boards.

Also, according to the present disclosure, even if the orientation of a chip which has a fixed position for inputting signals is changed, signals can be input from either a first signal input part or a second input part.

Also, according to the present disclosure, even if the size of the monitoring window is reduced, the monitoring window can be aligned to the entire chip. Stable power can be supplied to the chip, because the monitoring window can be made smaller.

Also, according to the present disclosure, stable power can be supplied to the chip.

Also, according to the present disclosure, preparing a plurality of evaluation boards in advance is no longer necessary, and expenses can be significantly reduced when implementing failure location detection.

What is claimed is:

1. An evaluation board, on which is mounted a chip to be evaluated, said evaluation board comprising:
    a first signal input part having a plurality of signal input lands for inputting a first signal to said chip;
    a second signal input part having a plurality of signal input lands for inputting a second signal to said chip;
    a monitoring window placed between the first signal input part and the second signal input part for monitoring the surface of the chip mounted on the evaluation board;
    a power supply part having a plurality of power supply lands for supplying power to the chip mounted on the evaluation board, the power supply part is placed between the second signal input part and the monitoring window; and
    a ground part having a plurality of ground lands for grounding the chip mounted on the evaluation board, the ground part is placed between the second signal input part and the monitoring window, wherein
    all of the power supply lands and the ground lands are placed between the second signal input part and the monitoring window, and no signal input lands are placed between the monitoring window and any of the power supply lands or the ground lands.

2. The evaluation board according to claim 1, wherein the signal input lands of the first signal input part and the signal input lands of the second signal input part are placed in a linear manner.

3. The evaluation board according to claim 1, further comprising:
    an interface for connecting the evaluation board to a tester for testing the chip mounted on the evaluation board.

4. The evaluation board according to claim 1, wherein the power supply land and the ground land are placed on the evaluation board alternately.

5. The evaluation board according to claim 1, wherein
    no power supply land and no ground land is disposed between the first signal input part and the monitoring window.

6. The evaluation board according to claim 1, further comprising:
    multiple third signal input parts arranged to be perpendicular to multiple said first signal input parts placed in a linear manner or said second signal input parts, wherein said third signal input parts input third signals to said chip; and
    fourth signal input parts placed as to sandwich said monitoring window between itself and said third signal input parts, wherein said fourth signal input parts input fourth signals to said chip.

7. The evaluation board according to claim 6, wherein said power supply part and said ground part are placed between said monitoring window, said first signal input part, said second signal input part, said third signal input part, and said fourth signal input part.

* * * * *